(12) United States Patent
Dave et al.

(10) Patent No.: US 9,672,804 B2
(45) Date of Patent: Jun. 6, 2017

(54) HEARING AID COMPATIBLE AUDIO DEVICE WITH ACOUSTIC NOISE CANCELLATION

(71) Applicant: Apple Inc., Cupertino, CA (US)

(72) Inventors: Ruchir M. Dave, San Jose, CA (US); Shaohai Chen, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/795,298

(22) Filed: Jul. 9, 2015

(65) Prior Publication Data

US 2015/0310847 A1    Oct. 29, 2015

Related U.S. Application Data

(62) Division of application No. 13/444,568, filed on Apr. 11, 2012, now Pat. No. 9,084,063.

(51) Int. Cl.

| | |
|---|---|
| *G10K 11/178* | (2006.01) |
| *H04R 25/00* | (2006.01) |
| *G10K 11/16* | (2006.01) |
| *G11C 13/00* | (2006.01) |
| *H04R 1/10* | (2006.01) |

(Continued)

(52) U.S. Cl.
CPC ......... *G10K 11/178* (2013.01); *H04R 25/554* (2013.01); *G10K 11/16* (2013.01); *G10K 2210/1081* (2013.01); *G11C 13/00* (2013.01); *G11C 13/0023* (2013.01); *G11C 13/0061* (2013.01); *H04M 1/6041* (2013.01); *H04M 1/72591* (2013.01); *H04R 1/1083* (2013.01); *H04R 2225/41* (2013.01);

(Continued)

(58) Field of Classification Search
CPC ........... H04M 1/6041; H04M 1/72591; H04R 2205/041; H04R 25/505; H04R 25/554; H04R 2460/01; H04R 2499/11; H04R 2225/51; H04R 2225/49; H04R 2225/41; G10K 11/178; G10K 11/16; G10K 2210/00; G10K 2210/301; G10K 2210/1081; G11C 13/0061; G11C 13/00; G11C 13/0023

See application file for complete search history.

(56) References Cited

U.S. PATENT DOCUMENTS

| | | |
|---|---|---|
| 5,450,499 A | 9/1995 | Morris et al. |
| 5,557,673 A | 9/1996 | Ginzburg |

(Continued)

*Primary Examiner* — Davetta W Goins
*Assistant Examiner* — Kuassi Ganmavo
(74) *Attorney, Agent, or Firm* — Blakely, Sokoloff, Taylor & Zafman LLP

(57) ABSTRACT

A portable audio device, which includes active noise cancellation circuitry, a hearing aid compliant magnetic radiator, and a speaker/earpiece, is surrounded by ambient acoustic noise. The active noise cancellation circuitry provides an anti-noise signal at an input of the speaker to control/reduce the ambient acoustic noise outside of the device. In addition, the active noise cancellation circuitry provides an inverse anti-noise signal to an input of the magnetic radiator. The magnetic fields produced by the speaker driven by the anti-noise signal and the magnetic radiator driven by the inverse anti-noise signal cancel each other out through phase cancellation such that a hearing aid using a telecoil coupled to the audio device does not produce significant audio waves based on either of these signals. Other embodiments are also described.

20 Claims, 7 Drawing Sheets

(51) Int. Cl.
  *H04M 1/725* (2006.01)
  *H04M 1/60* (2006.01)

(52) U.S. Cl.
  CPC ...... *H04R 2225/49* (2013.01); *H04R 2225/51* (2013.01); *H04R 2460/01* (2013.01); *H04R 2499/11* (2013.01)

(56) References Cited

U.S. PATENT DOCUMENTS

| | | | |
|---|---|---|---|
| 5,740,257 A | 4/1998 | Marcus | |
| 6,061,456 A | 5/2000 | Andrea et al. | |
| 6,381,308 B1 | 4/2002 | Cargo et al. | |
| 6,463,316 B1 | 10/2002 | Brungart | |
| 7,646,865 B2 | 1/2010 | Welsh et al. | |
| 7,764,798 B1 * | 7/2010 | Prather | H04R 25/554 381/23.1 |
| 7,787,648 B1 * | 8/2010 | Frerking | H04R 25/50 381/317 |
| 8,792,670 B2 | 7/2014 | Schoerkmaier | |
| 2005/0201577 A1 * | 9/2005 | Kariniemi | H04R 25/453 381/312 |
| 2006/0126873 A1 * | 6/2006 | Lee | H04R 25/554 381/312 |
| 2006/0188118 A1 * | 8/2006 | Berger | H04M 1/6016 381/315 |
| 2007/0036367 A1 | 2/2007 | Ko | |
| 2007/0041606 A1 | 2/2007 | Sheppard | |
| 2007/0263847 A1 | 11/2007 | Konchitsky | |
| 2010/0195857 A1 * | 8/2010 | Gebhardt | H04R 25/554 381/317 |
| 2010/0311463 A1 | 12/2010 | Konchitsky et al. | |
| 2012/0148062 A1 | 6/2012 | Scarlett et al. | |
| 2012/0316872 A1 * | 12/2012 | Stoltz | G10L 21/0216 704/233 |
| 2013/0273862 A1 * | 10/2013 | Frenzer | H04M 1/6066 455/90.2 |

* cited by examiner

HEARING AID COMPATIBLE AUDIO DEVICE WITH ACOUSTIC NOISE CANCELLATION

This application is a divisional of co-pending U.S. application Ser. No. 13/444,568 filed on Apr. 11, 2012.

BACKGROUND

An embodiment of the invention generally relates to an audio device that reduces interference caused by active noise cancellation circuitry picked-up by a hearing aid that is electromagnetically coupled to the audio device. Other embodiments are also described.

Ambient acoustic noise is background audio waves that may be heard by a user. Many mobile phones have been equipped with active noise cancellation circuitry to reduce or eliminate the effect ambient acoustic noise has on a user of the mobile phone. For example, a user of a mobile phone may be conducting a phone call at a baseball game with substantial ambient acoustic noise surrounding the event. The ambient acoustic noise surrounding the baseball game could include cheering fans, yelling vendors, and a public address system. The user's mobile phone includes active noise cancellation circuitry that senses the ambient acoustic noise through a microphone embedded in the mobile phone. The active noise cancellation circuitry generates an audio noise cancellation signal based on the sensed ambient acoustic noise. The active noise cancellation signal is played to the user through a speaker/earpiece of the mobile phone and negates or greatly reduces the perceived effect of the ambient acoustic noise to the user. Although active noise cancellation circuitry is effective in reducing effects of ambient acoustic noise on non-hearing impaired users, active noise cancellation circuitry often produces interference for hearing impaired users who use mobile phones with a hearing aid.

A hearing aid is typically worn by someone who suffers from hearing loss, and can compensate for the hearing impairment by amplifying the local sound field. Hearing aids operate in either a microphone (acoustic) mode or a telecoil (inductive) mode. In the microphone mode, sound waves that are incident upon a microphone which is integrated in the hearing aid are converted into an electrical audio signal. In the telecoil mode, an induction coil (also referred to as a telecoil or T-coil), which may also be inside the hearing aid, picks up the local magnetic field that has been modulated by the receiver or a dedicated coil of a nearby telephone handset. In both modes, the resultant electrical audio signal that has been picked up is subsequently processed, amplified and then converted to sound (by a small speaker inside the hearing aid) that can be heard by the user.

In telecoil mode, hearing aids typically turn-off their internal microphone and only receive audio that has been modulated by the receiver of a nearby telephone handset. Accordingly, the hearing impaired user would not be able to hear the ambient acoustic noise at the baseball game as the hearing aid is not picking up the ambient acoustic noise. Thus, the audio cancellation signal that is played to the user through a speaker/earpiece of the hearing aid would provide noise or interference to the hearing impaired user since there is no perceived ambient acoustic noise for the audio cancellation signal to reduce or negate.

SUMMARY

There is as need for an audio device that reduces interference caused by active noise cancellation circuitry picked-up by as hearing aid that is electromagnetically coupled to the audio device.

An embodiment of the invention is a portable audio device that includes active noise cancellation circuitry, a hearing aid compliant magnetic radiator, and a speaker/earpiece. The audio device is surrounded by ambient acoustic noise that consists of background audio waves that are not the primary focus of a user of the audio device. The active noise cancellation circuitry provides an anti-noise signal at an input of the speaker to control/reduce the ambient acoustic noise outside of the device. In addition, the active noise cancellation circuitry provides an inverse anti-noise signal to an input of the magnetic radiator. The magnetic fields produced by the speaker driven by the anti-noise signal and the magnetic radiator driven by the inverse anti-noise signal cancel each other out through phase cancellation such that a hearing aid using a telecoil coupled to the audio device does not produce significant audio waves based on either of these signals. Cancellation of the anti-noise signal produced by the active noise cancellation circuitry allows for both traditional noise cancellation for non-hearing impaired users while eliminating interference that may be experienced by hearing impaired users caused by active noise cancellation circuitry.

The above summary does not include an exhaustive list of all aspects of the present invention. It is contemplated that the invention includes all systems and methods that can be practiced from all suitable combinations of the various aspects summarized above, as well as those disclosed in the Detailed Description below and particularly pointed out in the claims filed with the application. Such combinations have particular advantages not specifically recited in the above summary.

BRIEF DESCRIPTION OF THE DRAWINGS

The embodiments of the invention are illustrated by way of example and not by way of limitation in the figures of the accompanying drawings in which like references indicate similar elements. It should be noted that references to "an" or "one" embodiment of the invention in this disclosure are not necessarily to the same embodiment, and they mean at least one.

DETAILED DESCRIPTION

Several embodiments of the invention with reference to the appended drawings are now explained. Whenever the shapes, relative positions and other aspects of the parts described in the embodiments are not clearly defined, the scope of the invention is not limited only to the parts shown, which are meant merely for the purpose of illustration. Also, while numerous details are set forth, it is understood that some embodiments of the invention may be practiced without these details, in other instances, well-known circuits, structures, and techniques have not been shown in detail so as not to obscure the understanding of this description.

Figure 1A:
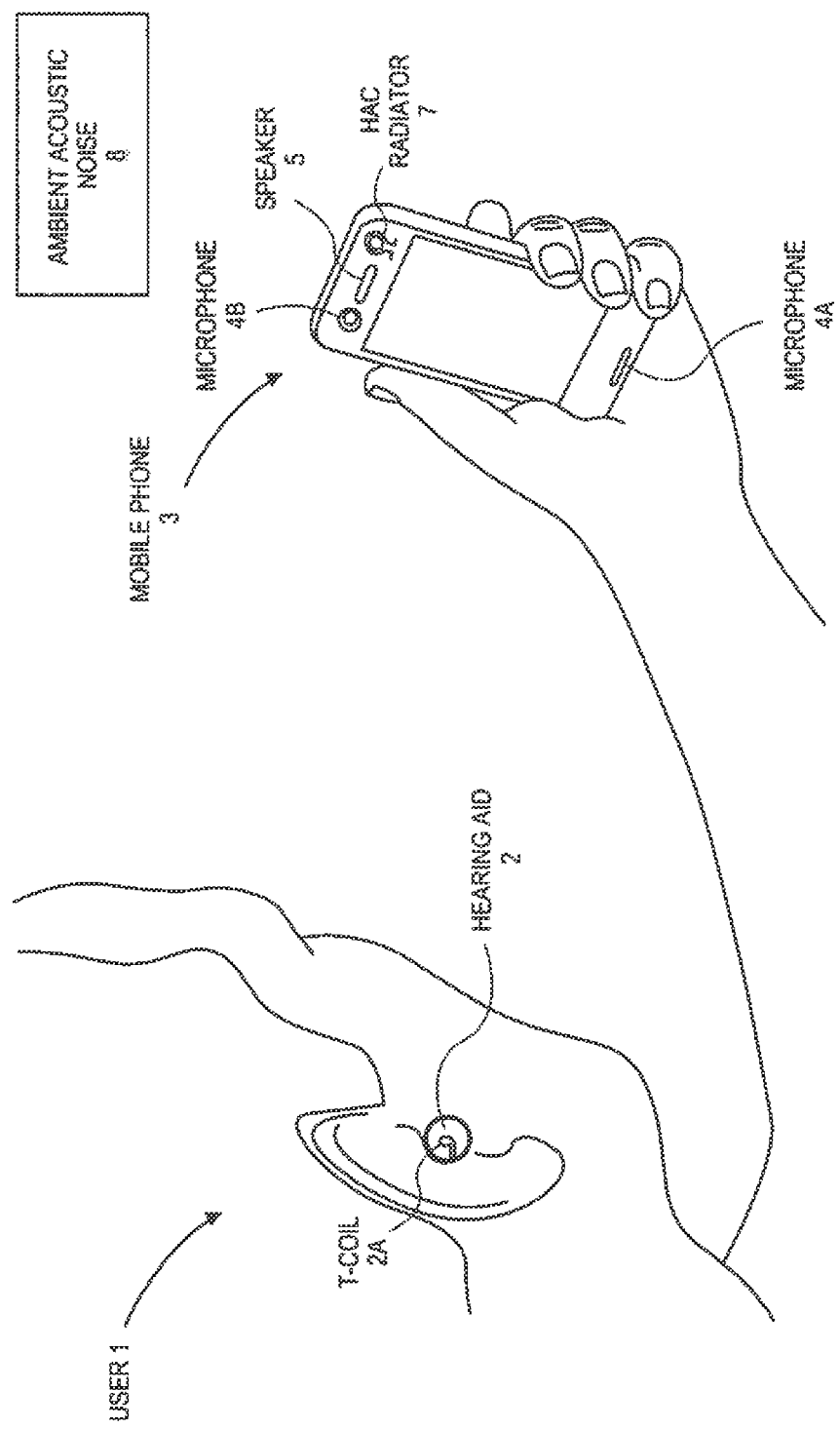
FIG. 1a illustrates a hearing impaired user holding an example portable audio device in his hand.

FIG. 1a shows a hearing impaired user 1 wearing a hearing aid 2 with an integrated telecoil 2A. The telecoil 2A is an induction loop that may pick up magnetic waves and covert these magnetic waves to acoustic sound waves. The hearing aid 2 is electromagnetically coupled to a mobile phone 3 using the telecoil 2A. The mobile phone 3 may be an Iphone™ mobile phone designed by Apple Inc. Although a mobile phone is shown and described hereinafter, any audio device that includes a speaker can be used. For example, the mobile phone 3 may instead be a MP3 player, a desk phone, a desktop computer, or a laptop computer.

The mobile phone 3 may include a hardware processor, discrete mercury, as touch sensitive screen, microphones 4a and 4b, a speaker 5, an audio processing chip 6, and a magnetic field radiator 7.

The hearing aid 2 may include the telecoil 2A, an earpiece speaker, and a microphone. The hearing aid 2 may operate in a microphone mode or in an inductive mode. In a microphone mode, the microphone picks-up nearby auditory sounds and plays these sounds through the earpiece speaker. In the inductive mode, the telecoil 2A is electromagnetically coupled to a speaker of an audio device (such as speaker 5 in mobile phone 3). This electromagnetic coupling allows the telecoil 2A to pick up electromagnetic waves emitted by the voice coil of the speaker 5 of the mobile phone 3. The electromagnetic waves picked up by the telecoil 2A are waves that are generated by the voice coil of the speaker 5 as it pushes a speaker cone back and forth. The electromagnetic waves are transformed into an audio signal and played through the earpiece speaker of the hearing aid 2. While in the telecoil mode, the microphone of the hearing aid 2 is turned off such that the only audio sounds played through the hearing aid's speaker are based on electromagnetic waves picked up by the telecoil 2A.

Figure 1B:
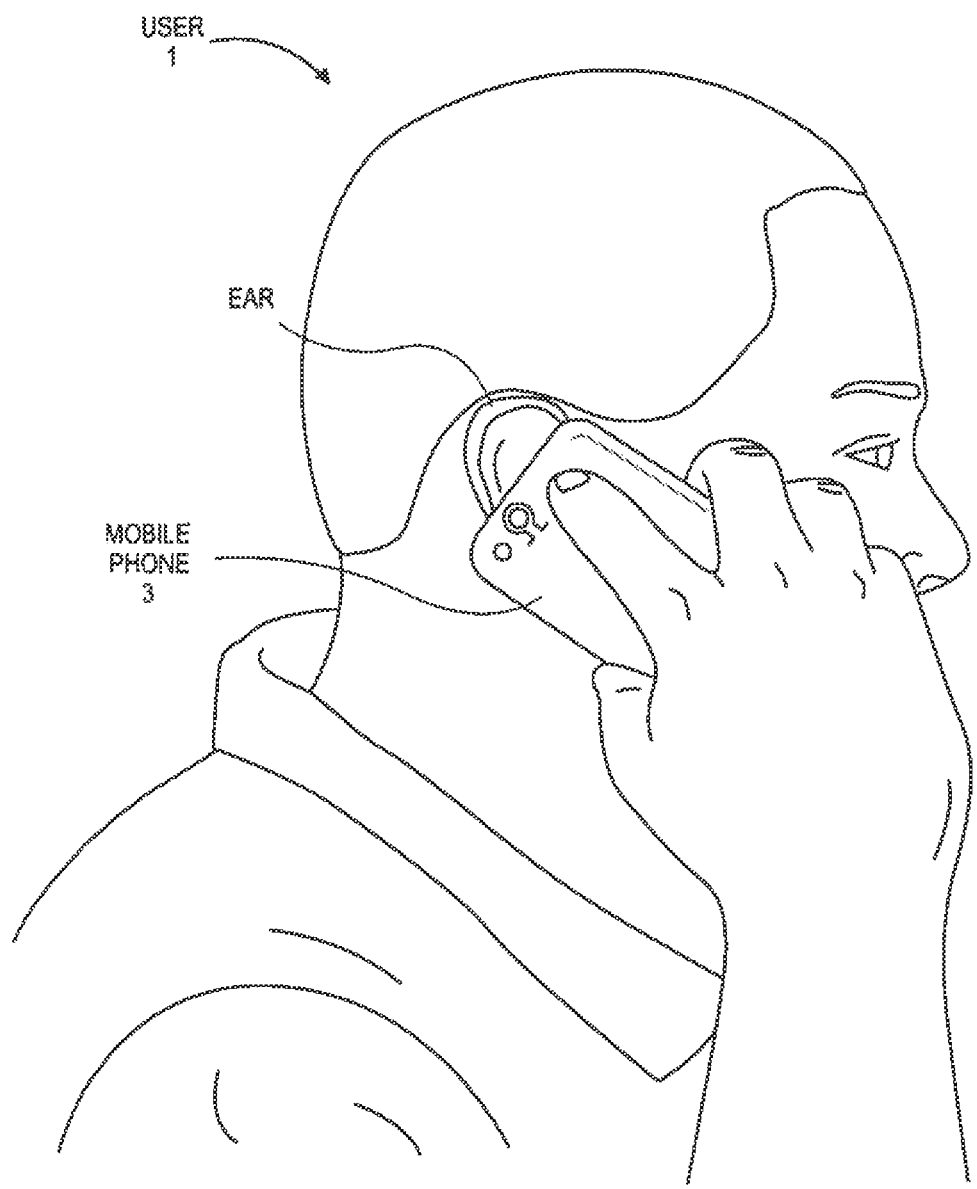
FIG. 1b illustrates the hearing impaired user placing the example portable audio device against his ear at which a hearing aid is located.

FIG. 1b illustrates the user 1 placing the mobile phone 3 and in particular the acoustic port of the speaker 5 up against his ear during the call, so as to better hear the voice of the far-end user.

As shown in FIG. 1a, the user 1 and the mobile phone 3 are located in an area that includes ambient acoustic noise 8. The ambient acoustic noise 8 is background audio waves that are not the primary focus of the user 1. For example, the user 1 may be making a phone call at a baseball game using the mobile phone 3. In this scenario, the sounds emitted by the far-end user and received by the mobile phone 3 through a downlink signal constitute foreground audio waves while the sounds produced by cheering fans, yelling vendors, and a public address system at the baseball game constitute the ambient acoustic noise 8 that the user 1 does not wish to listen to during the phone call.

Figure 2:
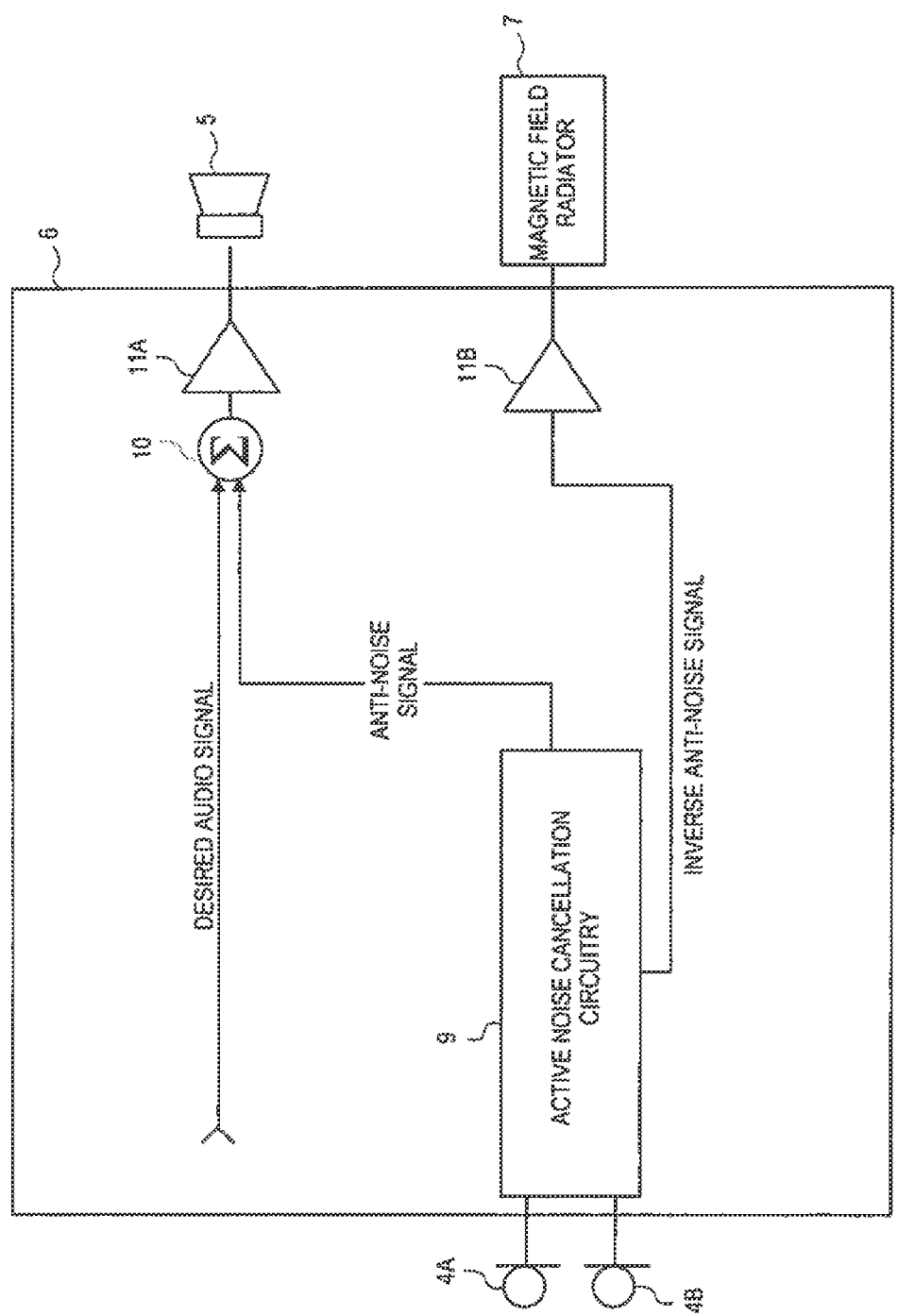
FIG. 2 shows an audio processing chip that may be included in the portable audio device of FIGS. 1a and 1b.

FIG. 2 shows an audio processing chip 6 that may be included in the mobile phone 3 to help eliminate or cancel out the ambient acoustic noise 8 for a user that does not use a hearing aid in telecoil mode while not producing interference or noise for the user 1 that is using the hearing aid 2 in telecoil mode. The audio processing chip 6 may include active noise cancellation circuitry 9, a mixer 10, and drivers 11A, 11B. The audio processing chip 6 is connected to the speaker 5 and the magnetic field radiator 7. Each of these elements will be described by way of example.

In one embodiment, all of the components illustrated in FIG. 2 may be integrated within a single housing of the mobile phone 3. Although the magnetic field radiator 7 is shown in a top portion of the mobile phone 3 in FIG. 1A, the magnetic field radiator 7 may be located at another location in the mobile phone 3. For example, the magnetic field radiator 7 may be located in the bottom of the mobile phone 3 adjacent to the microphone 4a. Alternatively, the speaker 5 and/or the magnetic field radiator 7 may be outside the housing that contains most of the other components, and may be communicatively connected by a cable or wireless link to the other components.

The active noise cancellation circuitry 9 is coupled to the microphones 4a and 4b, which pick-up the ambient acoustic noise 8 surrounding the mobile phone 3. The microphones 4a and 4b feed an ambient noise audio signal, which represents the ambient acoustic noise 8, to the active noise-cancellation circuitry 9. In the example provided above, the ambient noise audio signal is a recording of the cheering fans, yelling vendors, and public address system at the baseball game while the user 1 is conducting a phone call with a far end user. The microphones 4a and 4b may jointly or individually provide the ambient noise audio signal to the active noise cancellation circuitry 9. For example, the microphone 4b may pick-up the ambient acoustic noise 8 surrounding the mobile phone 3 and feed the resulting ambient noise audio signal to the active noise cancellation circuitry 9 while the microphone 4b is turned off or is dedicated to picking-up the near-end user's voice to be used in a uplink audio signal and/or sidetone signal. The active noise cancellation circuitry 9 processes the ambient noise audio signal to generate an anti-noise signal. This may be an entirely conventional feedback or feed forward active noise cancellation mechanism. The anti-noise signal reduces or eliminates the effects of the ambient acoustic noise 8 when played to the user 1 through a speaker or earpiece such that the ambient acoustic noise 8 cannot be heard but desired audio (e.g. a downlink audio signal from a far end user) can be heard more clearly. In one embodiment, the anti-noise signal represents a sound wave with the same amplitude but with an inverted phase (i.e. antiphase) with respect to a sound wave representing the ambient acoustic noise 8. When combined, the anti-noise signal cancels or greatly reduces the effect of the ambient acoustic noise 8 through phase cancellation.

As shown in FIG. 2, the anti-noise signal is combined with the desired audio signal by the mixer 10. The combined anti-noise signal and desired audio signal is thereafter fed to power amplifier 11A. The power amplifier 11A amplifies the received signal to drive the speaker 5 and output the combined anti-noise signal and desired audio signal to the user 1.

Figure 3:
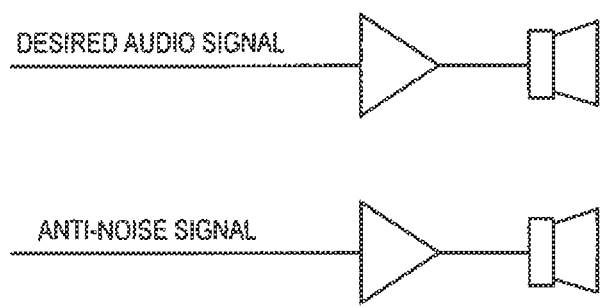
FIG. 3 shows a desired audio signal and an anti-noise signal fed to two separate speakers in the portable audio device of FIGS. 1a and 1b.

In one embodiment, the desired audio signal and anti-noise signal are fed to separate speakers as shown in FIG. 3. The speakers output either the desired audio signal or anti-noise signal, respectively, to the user 1 such that the mixer 10 does not need to combine these separate audio signals.

As described above, the electromagnetic waves produced by the voice coil inside the speaker 5 pushing a speaker cone back and forth may be picked up by a telecoil 2A embedded in the hearing aid 2. The telecoil 2A along with audio circuitry in the hearing aid 2 converts the electromagnetic waves to an audio signal that includes both the desired audio signal and the anti-noise signal. The audio signal, including both the desired audio signal and the anti-noise signal, is played to the user 1 through a speaker of the hearing aid 2 based on the picked up electromagnetic waves.

To eliminate or reduce interference caused by only hearing an anti-noise signal without the corresponding ambient acoustic noise 8, the active noise cancellation circuitry 9 also generates an inverse anti-noise signal simultaneously with the anti-noise signal. The inverse anti-noise signal is generated by inverting the anti-noise signal or by generating an out-of-phase version of the anti-noise signal. When combined, the inverse anti-noise signal cancels the effect of the anti-noise signal through phase cancellation. In one embodiment, the inverse anti-noise signal is the ambient noise audio signal, which represents the ambient acoustic noise 8.

The inverse anti-noise signal is fed to power amplifier 11B. The power amplifier 11B amplifies the received signal to drive the magnetic field radiator 7. The magnetic field radiator 7 radiates/emits electromagnetic waves based on the inverse anti-noise signal. The electromagnetic waves emitted by the magnetic field radiator 7 are picked-up by the telecoil 2A embedded within hearing aid 2 and are played by a speaker or earpiece embedded within the hearing aid 2. By playing an inverse anti-noise signal to the user 1, the audio effects of the anti-noise signal as perceived by the user 1 are cancelled out through phase cancellation without affecting a non-hearing impaired user's ability to use the active noise cancellation features of the mobile phone 3.

Figure 4:
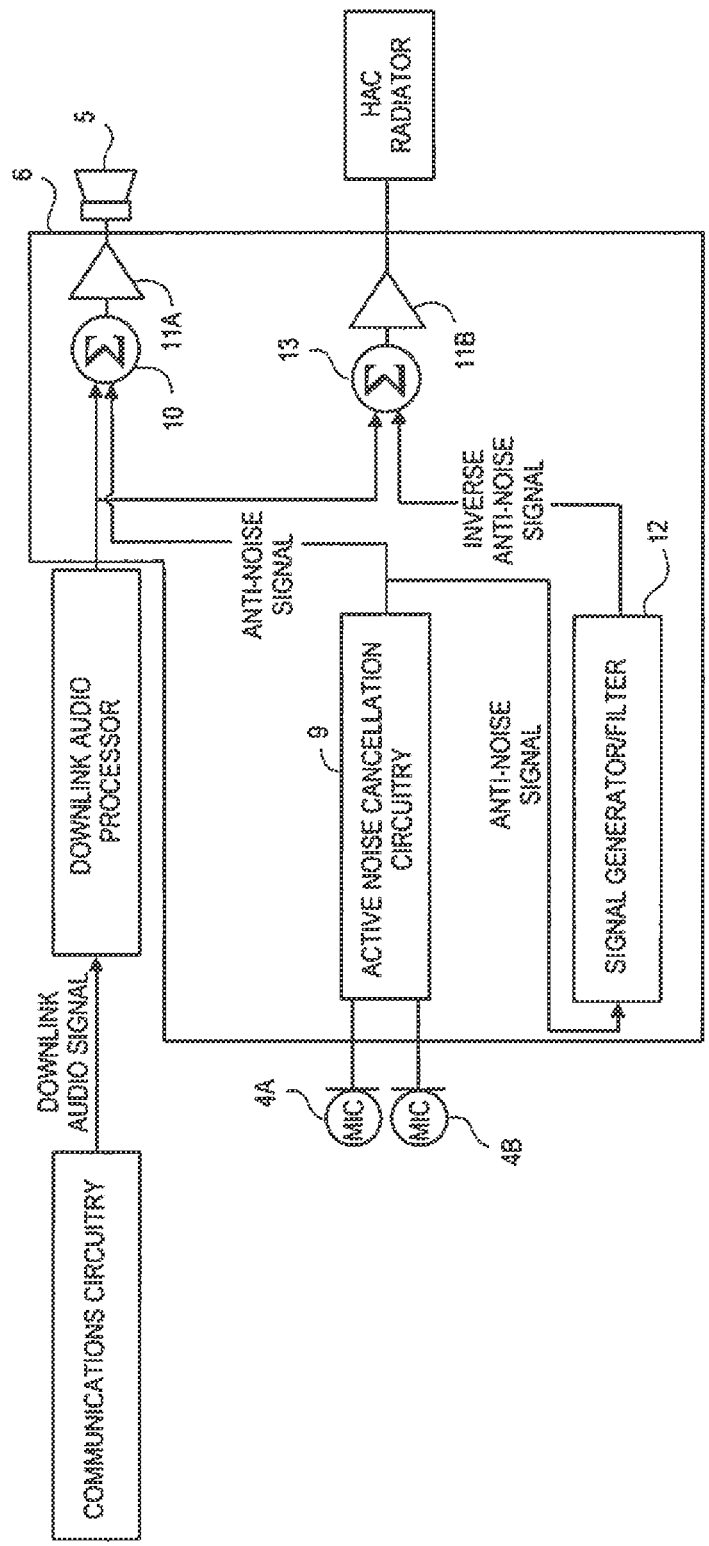
FIG. 4 shows an embodiment of the audio processing chip of FIG. 2 with a signal generator for producing an inverse anti-noise signal.

As described above and shown in FIG. 2, active noise cancellation circuitry 9 produces both the anti-noise signal and the inverse anti-noise-signal. In an alternate embodiment, the inverse anti-noise signal may be generated and fed to the magnetic field radiator 7 by a signal generator/filter 12 that is separate from the active noise cancellation circuitry 9 as shown in FIG. 4. In one embodiment, the signal generator 12 may be an inverse amplifier that is fed the anti-noise signal from the active noise cancellation circuitry 9 and outputs the inverse anti-noise signal based on this input.

Figure 5:
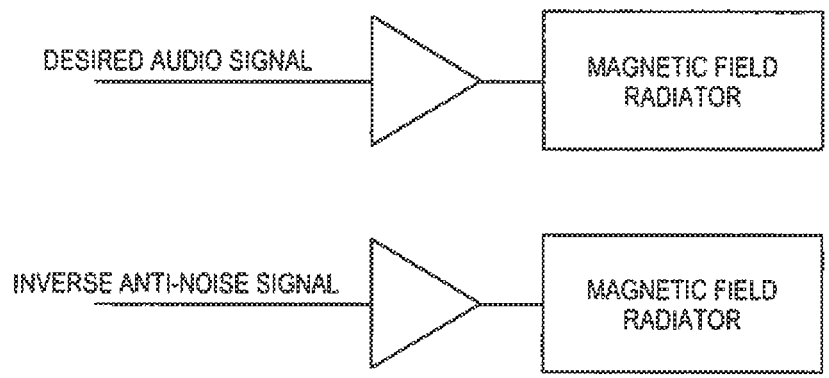
FIG. 5 shows a desired audio signal and an inverse anti-noise signal that are fed to separate magnetic field radiators.

As also shown in FIG. 4, the magnetic field radiator 7 may be fed as combined desired audio signal and inverse anti-noise signal. In this embodiment, mixer 13 combines the two signals and feeds the combined signal to the power amplifier 11B for driving the magnetic field radiator 7. In another embodiment, as shown in FIG. 5, the desired audio signal and the inverse anti-noise signal are fed to separate magnetic field radiators through distinct amplifiers.

As described above, the audio processing chip 6 allows for both traditional noise cancellation for non-hearing impaired users while eliminating interference that may be experienced by hearing impaired users caused by the active noise cancellation circuitry 9.

Figure 6:
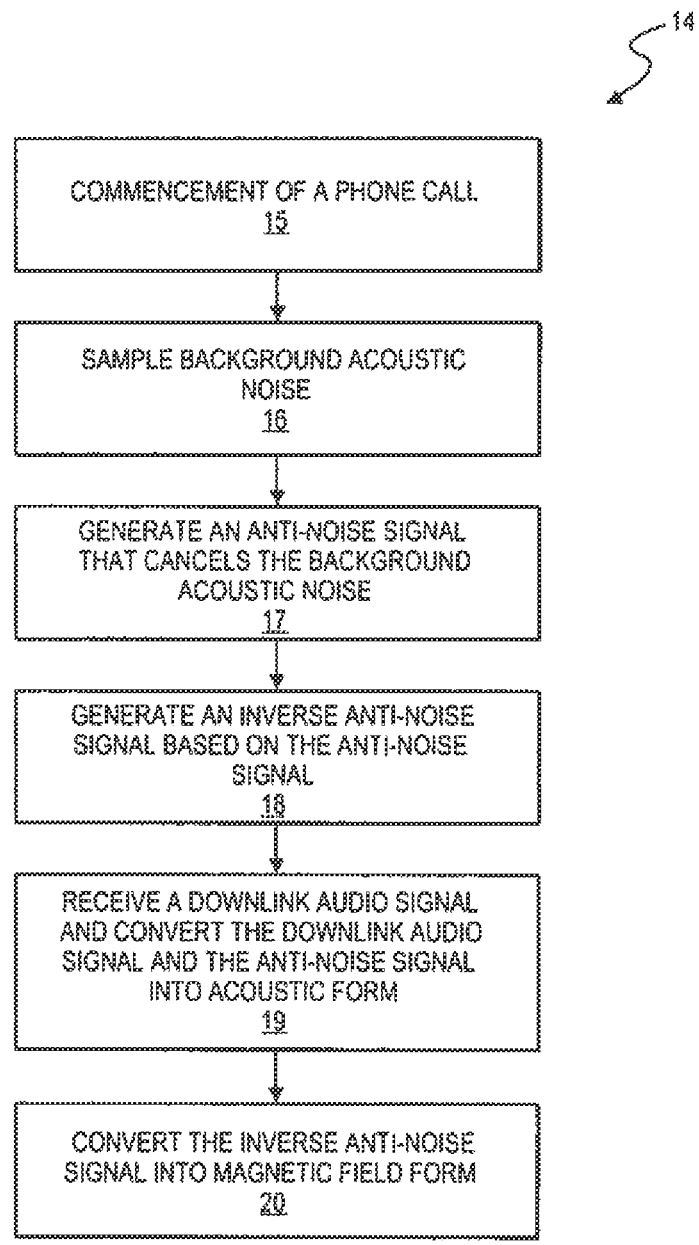
FIG. 6 shows a method for processing audio in a mobile phone using the audio processing chips of either FIG. 2 or FIG. 4.

Turning now to FIG. 6, a method for processing audio in a mobile phone 14 will be described using the audio processing chip 6. Each operation in the method 14 may be performed by one or more components of the audio processing chip 6 described above and shown in FIGS. 2-5.

The method for processing audio 14 begins at operation 15 with the receipt/commencement of a phone call between a near end phone, which is located in an area with background audio acoustic noise and a far end phone. The near end phone may include the audio processing chip 6. At operation 16, the background audio acoustic noise is sampled by active noise cancellation circuitry embedded within the audio processing chip. For example, the microphone 4b of the mobile phone 3 may pick up ambient acoustic noise 8 surrounding the mobile phone 3.

At operation 17, an anti-noise signal is generated by the active noise cancellation circuitry. The anti-noise signal reduces or eliminates the effects of the background acoustic noise when played through a speaker or earpiece such that the background acoustic noise cannot be heard but desired audio (e.g. a downlink audio signal) can be heard more clearly. In one embodiment, the anti-noise signal represents a sound wave with the same amplitude but with an inverted phase (i.e. antiphase) with respect to a sound wave representing the background acoustic noise.

At operation 18, an inverse anti-noise signal is generated by the audio processing chip 6. This may either be performed by the anti-noise cancellation circuitry or by a separate signal generator/filter. The inverse anti-noise signal is generated by inverting the anti-noise signal or by generating an out-of-phase version of the anti-noise signal. When combined, the inverse anti-noise signal cancels the effect of the anti-noise signal through phase cancellation.

At operation 19, a downlink audio signal is received and processed by a near end phone. The downlink audio signal may be transmitted from a far end user during a phone call. For example, the downlink audio signal may be transmitted by a mobile phone of a far end user and received by communication circuitry (a baseband processor) of a near end phone that includes the audio processing chip 6. After receipt of the downlink audio signal, the downlink audio signal and the anti-noise signal are converted into acoustic form. In one embodiment, this is performed by feeding the downlink audio signal and the anti-noise signal to separate speakers or earpieces. In other embodiments, the downlink audio signal and the anti-noise signal are combined using a mixer and the combined audio signal is output by a single speaker.

At operation 20, the inverse anti-noise signal is converted into magnetic field form. In one embodiment, converting the inverse anti-noise signal into magnetic form could be performed by a magnetic field generator that is fed the inverse anti-noise signal.

Although the operations in FIG. 6 are shown in a dependent relationship, each of these operations may be performed simultaneously and independent of each other. For example, in one embodiment after the commencement of a phone call and receipt of a downlink audio signal at operation 15, the method for processing audio in a mobile phone 14 performs operations 16-20 simultaneously and without dependence on each other.

To conclude, various aspects of an audio device that reduces interference caused by active noise cancellation circuitry picked-up by a hearing aid has been described. As explained above, an embodiment of the invention may be a machine-readable medium such as one or more solid state memory devices having stored thereon instructions which program one or more data processing components (generically referred to here as "a processor" or a "computer system") to perform some of the operations described above. In other embodiments, some of these operations might be performed by specific hardware components that contain hardwired logic. Those operations might alternatively be performed by any combination of programmed data processing components and fixed hardwired circuit components.

While certain embodiments have been described and shown in the accompanying drawings, it is to be understood that such embodiments are merely illustrative of and not restrictive on the broad invention, and that the invention is not limited to the specific constructions and arrangements shown and described, since various other modifications may occur to those of ordinary skill in the art. The description is thus to be regarded as illustrative instead of limiting.

What is claimed is:

1. A mobile phone, comprising:
mobile phone network communications circuitry to generate a downlink audio signal;
an earpiece speaker having an input to receive the downlink audio signal;
a hearing aid compatible (HAC) radiator having an input to receive the downlink audio signal;
active noise cancellation (ANC) circuitry to generate an anti-noise signal to control ambient acoustic noise;
a signal generator to generate an inverse anti-noise signal that is configured to cancel the anti-noise signal;
a first driver to drive the earpiece speaker based on the downlink audio signal and the anti-noise signal; and
a second driver to drive the HAC radiator based on the downlink audio signal and the inverse anti-noise signal.

2. The mobile phone of claim 1, further comprising:
a first combiner to digitally combine the downlink audio signal and the anti-noise signal; and
a second combiner to digitally combine the downlink audio signal and the inverse anti-noise signal.

3. The mobile phone of claim 1, wherein the signal generator is to generate the inverse anti-noise signal by inverting the anti-noise signal.

4. The mobile phone of claim 1, wherein the inverse anti-noise signal is an out-of-phase version of the anti-noise signal.

5. The mobile phone of claim 1, further comprising:
a microphone to pick up the ambient acoustic noise for use by the ANC circuitry.

6. The mobile phone of claim 5, wherein the microphone is a first microphone, wherein the mobile phone further comprises a second microphone, wherein the first and second microphones are configured to either jointly or individually pick up the ambient acoustic noise for use by the ANC circuitry.

7. The mobile phone of claim 5, wherein the HAC radiator and the microphone are located at a bottom of the mobile phone.

8. The mobile phone of claim 1, wherein the HAC radiator is positioned next to the earpiece speaker within a housing of the mobile phone.

9. The mobile phone of claim 1, wherein the HAC radiator is positioned outside of a housing of the mobile phone.

10. The mobile phone of claim 1, wherein the first driver drives the earpiece speaker contemporaneously as the second driver drives the HAC radiator.

11. For a mobile phone having an earpiece speaker and a hearing aid compatible (HAC) radiator, a method comprising:
receiving a downlink audio signal;
generating an anti-noise signal to control ambient acoustic noise;
generating an inverse anti-noise signal that is configured to cancel the anti-noise signal;
generating a first signal based on the downlink audio signal and the anti-noise signal to drive the earpiece speaker; and
generating a second signal based on the downlink audio signal and the inverse anti-noise signal to drive the HAC radiator.

12. The method of claim 11, wherein generating the first signal comprises digitally combining the downlink audio signal and the anti-noise signal, wherein generating the second signal comprises digitally combining the downlink audio signal and the inverse anti-noise signal.

13. The method of claim 11, wherein generating an inverse anti-noise signal comprises inverting the anti-noise signal to produce the inverse anti-noise signal.

14. The method of claim 11, wherein the inverse anti-noise signal is an out-of-phase version of the anti-noise signal.

15. The method of claim 11 further comprising detecting the ambient acoustic noise through a microphone of the mobile phone.

16. The method of claim 15, wherein the microphone is a first microphone, wherein detecting comprises picking up the ambient acoustic noise either through both the first and second microphones or through one of the first or second microphones.

17. The method of claim 15, wherein the HAC radiator and the microphone are located at a bottom of the mobile phone.

18. The method of claim 11, wherein the HAC radiator is positioned next to the earpiece speaker within a housing of the mobile phone.

19. The method of claim 11, wherein the HAC radiator is positioned outside of a housing of the mobile phone.

20. The method of claim 11 further comprising driving, contemporaneously, both the earpiece speaker and the HAC radiator with the first and second signals, respectively.

* * * * *